(12) United States Patent
Martín Pérez et al.

(10) Patent No.: US 12,135,275 B2
(45) Date of Patent: Nov. 5, 2024

(54) MECHANO-OPTICAL ANALYSIS SYSTEM, METHOD FOR PRODUCING SAME, USE FOR IDENTIFYING AND CLASSIFYING CELL POPULATIONS AND MECHANO-OPTICAL ANALYSIS METHOD

(71) Applicant: CONSEJO SUPERIOR DE INVESTIGACIONES CIENTÍFICAS, Madrid (ES)

(72) Inventors: Alberto Martín Pérez, Madrid (ES); Daniel Ramos Vega, Madrid (ES); Montserrat Calleja Gómez, Madrid (ES); Francisco Javier Tamayo De Miguel, Madrid (ES); Óscar Malvar Vidal, Madrid (ES)

(73) Assignee: CONSEJO SUPERIOR DE INVESTIGACIONES CIENTÍFICAS (CSIC), Madrid (ES)

( * ) Notice: Subject to any disclaimer, the term of this patent is extended or adjusted under 35 U.S.C. 154(b) by 592 days.

(21) Appl. No.: 17/603,161

(22) PCT Filed: Apr. 13, 2020

(86) PCT No.: PCT/ES2020/070236
§ 371 (c)(1),
(2) Date: May 11, 2022

(87) PCT Pub. No.: WO2020/208285
PCT Pub. Date: Oct. 15, 2020

(65) Prior Publication Data
US 2022/0283076 A1 Sep. 8, 2022

(51) Int. Cl.
*G01N 15/14* (2024.01)
*H10N 30/50* (2023.01)
(Continued)

(52) U.S. Cl.
CPC ..... *G01N 15/1459* (2013.01); *G01N 15/1425* (2013.01); *H10N 30/50* (2023.02); *H10N 30/80* (2023.02); *G01N 2015/1438* (2013.01)

(58) Field of Classification Search
None
See application file for complete search history.

(56) References Cited

U.S. PATENT DOCUMENTS

2017/0089881 A1* 3/2017 Bahl ................. G01N 29/2418

FOREIGN PATENT DOCUMENTS

| CN | 207540944 U | 6/2018 | |
| WO | WO-2016055683 A1 * | 4/2016 | ............ G01J 3/0208 |

OTHER PUBLICATIONS

"High-throughput label-free molecular fingerprinting flow cytometry," Hiramatsu et al., Science Advances, vol. 5, Issue 1, Jan. 2019, https://www.science.org/doi/10.1126/sciadv.aau0241) (Year: 2019).*

(Continued)

*Primary Examiner* — Uzma Alam
*Assistant Examiner* — Chad Andrew Reverman
(74) *Attorney, Agent, or Firm* — Hayes Soloway P.C.

(57) ABSTRACT

An analysis system includes a reflective substrate; a hollow elongate structure with two ends; two polymer supports coupled to the ends and joined to the substrate; a piezoelectric device coupled to the substrate and designed to produce vibrations in the elongate structure; a laser for emitting a beam; a beam splitter; a photodetector; an amplification module; and a processor. The laser beam passes through the cavity and is absorbed by the photodetector, which generates a signal that is transmitted to the amplification module. The amplification module separates the signal into a modulated component and an unmodulated component. The signal is transmitted to the processor to obtain the resonance fre- (Continued)

quency and reflectance and to provide the piezoelectric device with an excitation signal at the resonance frequency.

16 Claims, 4 Drawing Sheets

(51) Int. Cl.
*H10N 30/80* (2023.01)
*G01N 15/1434* (2024.01)

(56) References Cited

OTHER PUBLICATIONS

Kotaro Hiramatsu, "High-Throughput Label-Free Molecular Fingerprinting Flow Cytometry", Article, 2019, pp. 1-8, vol. 5, Science Advances.
Kewen Han, "High-Throughput Sensing of Freely Flowing Particles with Optomechanofluidics", Article, 2016, pp. 585-591, vol. 3, No. 6, Optica.
Jeewon Suh, "Real-Time Sensing of Flowing Nanoparticles with Electro-Opto-Mechanics", Article, 2016, pp. 1-8, vol. 2, APL Photonics.
Anil B. Shrirao, "Microfluidic Flow Cytometry: The Role Microfabrication Methodologies, Performance and Functional Specification", Journal, 2018, pp. 1-56, vol. 6, No. 1, Technology (Singap World Science).
Jeewon Suh, "High Throughput Real-Time Sensing of Flowing Nanoparticles with Electro-Opto-Mechanics", Article, 2016, pp. 1-8, vol. 2, APL Photonics.

\* cited by examiner

MECHANO-OPTICAL ANALYSIS SYSTEM, METHOD FOR PRODUCING SAME, USE FOR IDENTIFYING AND CLASSIFYING CELL POPULATIONS AND MECHANO-OPTICAL ANALYSIS METHOD

CROSS-REFERENCE TO RELATED APPLICATIONS AND PRIORITY

This patent application claims priority from PCT Application No. PCT/ES2020/070236 filed Apr. 13, 2020, which claims priority from Spanish Patent Application No. P201930327 filed Apr. 10, 2019. Each of these patent applications are herein incorporated by reference in their entirety.

OBJECT OF THE INVENTION

The invention relates to a mechano-optical analysis system for analysing samples, more specifically, a system capable of identifying particles and/or biological cells in aqueous suspension or in physiological media.

The system of the invention allows mechanical and optical data to be obtained at the same time and combined such that it is possible to perform the unequivocal distinction of particles, even if they have the same buoyant mass.

BACKGROUND OF THE INVENTION

The detection of particles in fluid is critically important today for a number of applications, both in the health field and in the environmental or safety field, whereby there are different methods for detecting them. In addition to methods based on filtration and subsequent analysis, some of these methods are based on the use of resonators, which can use cantilevered elements which taken mechanical measurements as a result of being in resonance. The measurement method is based in the change in resonance frequency of the resonator due to the change in mass that is experienced when particles are added on the surface thereof. These methods allow for a high precision and resolution suited for applications of this type. When being used as mass sensors in a laboratory, it has even been possible to achieve a resolution sufficient for taking atomic sized measurements in controlled ultra-high vacuum and low temperature environments.

However, measurements are gravely deteriorated when attempting to apply these measurement techniques based on mechanical resonators under another type of environmental conditions, i.e., it is impossible to have strict control conditions, for example, in aqueous solutions such as physiological environments for biological applications. This is because the interaction with the environment, where viscous friction with a fluid surrounding the resonator dampens the movement. For this reason, hollow resonators transporting the liquid inside same rather than being surrounded by it have been developed.

Systems of this type, despite being extremely sensitive, have an added problem: the measurement of the mass in a sample that is immersed in a liquid is not direct. The change in frequency of the resonator is influenced by the difference in the mass of the particle and the volume of liquid it displaces, which is known as the buoyant mass. A method known for overcoming this limitation is to take measurements using several different carrier liquids with known mass densities. It is thereby possible to determine the influence of the density of the carrier liquid on taking the measurements, and to differentiate particles with the same buoyant mass. This differentiation is necessary; since the buoyant mass of a particle depends on the density and the volume thereof, two particles with a different density and volume could have the same buoyant mass and, therefore, result in the same change in resonance frequency in the resonator. However, this implies taking multiple measurements for the purpose of distinguishing between different analyte populations, with the subsequent cost and with a such a high complexity that in many cases it implies that it is impossible to take such measurements, because in biological analyses the carrier liquid must often be one specific liquid.

Other proposals are based on the measurement of other parameters of the particles, such as their compressibility. To that end, the resonance frequency of radial extensional modes of the resonator, which have a higher frequency and lower amplitude, is measured and can only be measured with the coupling of optical modes confined on the surface of the resonator. In order to excite said optical modes, the evanescent field of an optical fibre approximating the surface at a nanometric distance is often used. This process implies considerable technical complexity with a very high cost in elements for measuring mechanical modes which are already hard to measure.

DESCRIPTION OF THE INVENTION

The mechano-optical analysis system for analysing samples of the invention allows the unequivocal distinction of particles by means of the determination of their buoyant mass and reflectance, the system comprising:
  a reflective substrate;
  a hollow elongate structure having two ends;
  two polymer supports coupled to the ends of the hollow structure and joined to the reflective substrate;
  at least one piezoelectric device coupled to the reflective substrate and in contact with the hollow structure, and designed to produce vibrations in said structure;
  at least one laser configured for emitting a laser beam,
  at least one photodetector, designed to absorb the laser beam and produce an electrical signal (S1) associated with the intensity and frequency of the received laser beam,
  at least one amplification module coupled to the piezoelectric device and to the photodetector and configured for amplifying and filtering the electrical signal (S1) provided by the photodetector; and
  a processor coupled to the amplification module and configured for processing the amplified and filtered electrical signal (S1) for the purpose of providing a measurement of the resonance frequency of the cavity at each instant of time, which varies depending on the variation in the buoyant mass of the sample;
  wherein the laser beam passes through the cavity before reaching the photodetector, the photodetector generates a signal (S1) that is transmitted to the amplification module, said amplification module being designed for separating the modulated component (AC) and an unmodulated component (DC) of the signal (S1), and the processor is configured to obtain a measurement of the resonance frequency at each instant of time, from the modulated component (AC) of the signal (S1), and the reflectance inside the hollow structure at each instant of time, from the unmodulated component (DC) of the signal (S1), and to provide the piezoelectric device, through the amplification module, with an excitation signal (S2) at the resonance frequency for said piezoelectric device to produce vibrations in the cavity at the resonance frequency at each instant of time.

The use of optical measurement methods allows for a correct determination of the buoyant mass of the particles of the sample, providing a differentiation parameter between particles. It is thereby possible to distinguish between particles with the same buoyant mass but which are actually different.

Two particles with a different density and different volume can have the same buoyant mass, so the use of a laser beam and a photodetector to obtain a measurement of the reflectance of the particles circulating through the cavity allows to distinguish between these particles in real time, providing measurements of their buoyant mass and of the scattered light, performing a reliable analysis and reducing costs associated with taking measurements for differentiating these particles.

These advantages are due to the simultaneous acquisition of the buoyant mass and reflectance of each particle upon passing through the hollow structure, so even if the buoyant mass and reflectance were measured in consecutive but not simultaneous processes, the desired objective would not be achieved because the measurement obtained would be a mean buoyant mass of the sample and a mean reflectance of the sample, thus impeding the differentiation between particles in said sample.

The analysis system of the invention can further comprise optical elements which allow for better performance, and such elements include an optical isolator for preventing the laser beam from being able to return to the laser itself, causing a malfunction thereof.

Additionally, the system can comprise a neutral density filter for allowing the passage of light at a specific intensity and a non-polarised beam splitter, intended for splitting the light beam and diverting part of said beam in a specific direction, more specifically, the beam splitter can be placed at 45°, such that said splitter diverts part of the beam in the direction perpendicular to the original beam.

Preferably, the amplifier is synchronous, which allows the signal (S1) to be extracted even in the presence of significant noise in the signal.

Furthermore, the excitation signal (S2), which is sent to the piezoelectric device, is preferably a sinusoidal signal at the resonance frequency.

The piezoelectric device of the system can be made of ceramic, providing greater flexibility in the geometry and dimensions and improved properties with respect to other piezoelectric crystals.

Preferably, the hollow elongate structure is made of fused silica and has a diameter of about 50 µm, but it may reach up to 1 µm in diameter. The use of fused silica, which is a transparent material, allows the passage of the laser beam therethrough, for said beam to pass through the sample and reach the photodetector. The reduced diameter of the cavity furthermore causes the flow of particles to be orderly and not random.

The analysis system according to claim 1, wherein the polymer supports are made of SU8 photoresist, allowing for better control of the adherence thereof to the ends of the cavity.

The laser used to produce the beam can be a Helium-Neon laser as it is one of the most common and readily accessible lasers.

Preferably, the system also comprises a camera with an infinity objective lens having a sensor with photoelectric cells, a white light source and a monitor, which allows seeing the inside of the cavity.

The camera allows to verify if the laser is correctly placed for precisely aiming at the centre of the hollow elongate structure and, furthermore, no jamming takes place inside the cavity.

The system can further comprise a pump intended for controlling the flow of liquid inside the hollow structure. The pump of the system can be a syringe pump, or it can preferably be a pressurised gas pump, and more specifically a pressurised nitrogen and/or carbon dioxide pump, configured for controlling the flow inside the hollow elongate structure, while at the same time it prevents the occurrence of any noise in the measurement of the resonance frequency taken by the system. The pump thus allows a constant flow, without sudden abrupt variations that may affect said measurement, to be provided.

The invention also relates to a manufacturing method of the hollow elongate cavity suspended over the reflective substrate, comprising the steps of:
  providing a hollow elongate structure, with two ends, having a protective polyimide layer,
  removing the protective layer in the central area of the hollow elongate structure, heating said area,
  applying axial stress to the elongate structure without the protective layer, so as to plastically deform its central area until achieving a specific diameter,
  adhering two or more polymer supports (5) produced on a reflective substrate (2) at each of the ends (4) of the deformed hollow structure (3), with the structure (3) being suspended over the reflective substrate by means of the polymer supports (5).

The proposed manufacturing method allows an effective control of the diameter of the resulting hollow elongate structure, which determines the capacity of the system to allow an orderly flow of particles without impeding the passage of the particles to be analysed, and the suspended length, which controls the mechanical resonance frequency of the structure.

Preferably, the step of adhering polymer supports at each of the ends of the cavity is performed by means of a centrifugal coating and using optical lithography, which applies a defined polymer pattern at one of the ends of the hollow elongate structure.

Optical lithography is a widespread, inexpensive and simple technique as it allows a centrifugal coating to be performed and a pattern to be drawn, leaving part of the hollow structure embedded in the solid material of the coating while at the same time other parts are free of said coating. This method allows achieving high resolution and speed in performing the coating, while at the same time prevents being limited to structures having very little thickness.

The invention also relates to the use of the analysis system of the invention for identifying and classifying different cell populations present in an isolated biological sample. That is, according to this application, the described system allows to detect the existence and to differentiate at least different two lines or cell populations in the biological sample analysed, and to classify said cells.

Preferably, this aspect of the invention relates to identifying and classifying tumour cells and non-tumour cells. The system, therefore, allows to detect the presence of different cell populations in one and the same analysed sample and to classify said cells as tumour cells or non-tumour cells, which enables the application thereof in clinical practice, for example, for the in vitro diagnosis of tumours, preferably cancer tumours, from isolated biological samples of the patient. More preferably, the cells are epithelial cells, even more preferably from mammalian tissue.

DESCRIPTION OF THE DRAWINGS

As a complement to the description provided and for the purpose of helping to make the features of the invention more readily understandable, in accordance with a practical preferred exemplary embodiment thereof, said description is accompanied by a set of drawings which, by way of illustration and not limitation, represent the following.

PREFERRED EMBODIMENT OF THE INVENTION

The mechano-optical analysis system (1) for analysing samples of the invention allows the unequivocal distinction of particles by means of the simultaneous determination of their buoyant mass and reflectance. To that end, the fundamental mode of vibration of a transparent and hollow elongate structure (3), referred to as capillary, while liquid flows therein, is measured by interferometry. The fundamental mode of vibration, in contrast with the extensional radial modes, has a lower resonance frequency and a lower rigidity, therefore a larger amplitude. The measurement by means of said fundamental mode allows the interferometric optical measurement to be taken without the need to excite optical modes.

In contrast, to take the optical measurement, the system (1) of the invention uses an interference pattern generated with a reflective substrate (2) to measure the oscillation of the fundamental mode of vibration. The use of a transparent capillary (3) allows to measure the light scattered by the particles flowing therein, which allows the reflectance thereof to be measured and thus, from two parameters measured simultaneously, i.e., resonance frequency and reflectance, to differentiate between particles with the same buoyant mass.

Figure 1:
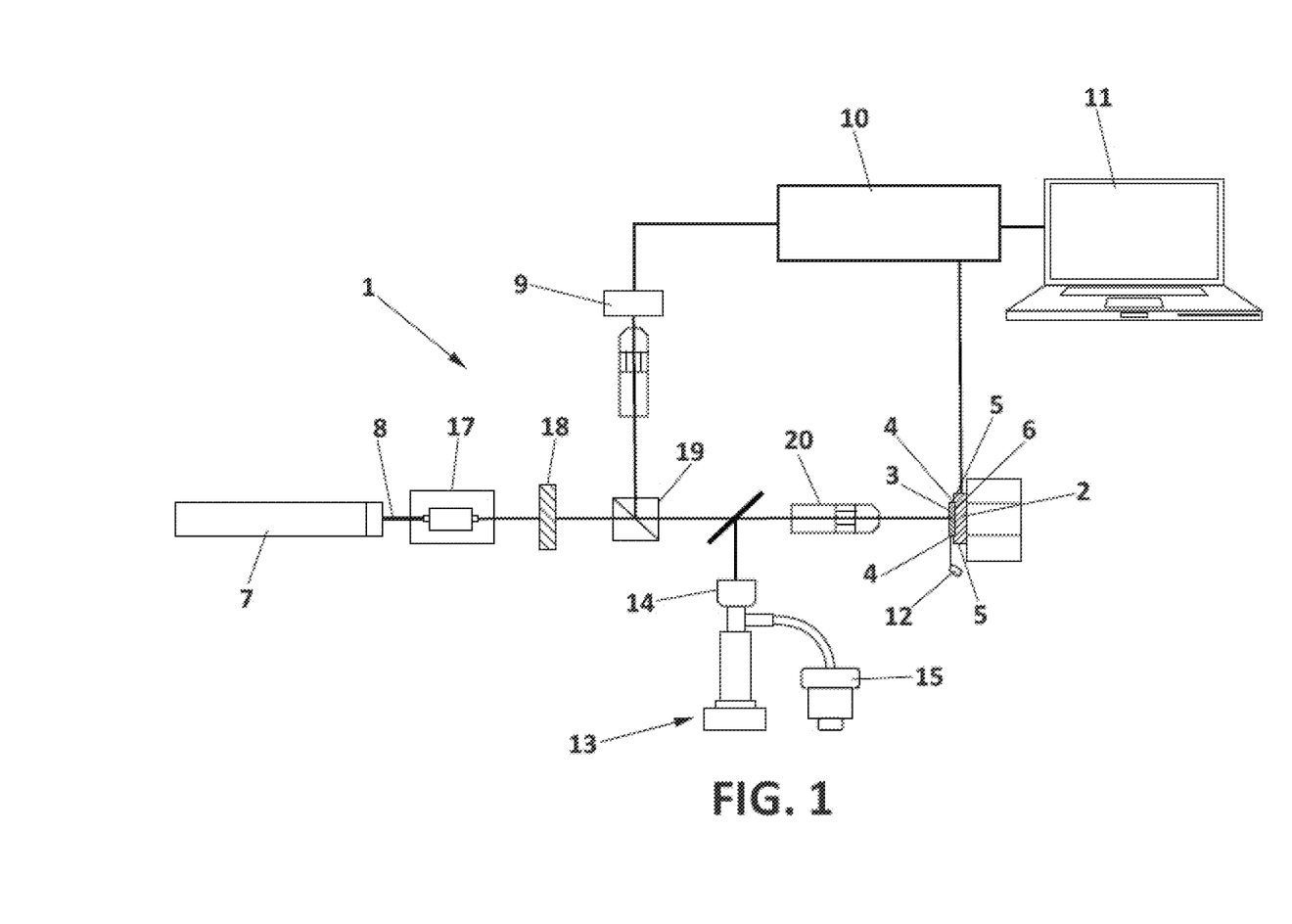
FIG. 1 shows a schematic view of a preferred embodiment of the system of the invention.

FIG. 1 shows a complete view of a preferred embodiment of the system (1) of the invention, capable of combining optical and mechanical measurements for the purpose of obtaining a correct determination of particles in aqueous suspension or cells in a physiological medium.

Mechanical measurements are taken by means of a resonating hollow elongate structure (3) arranged in the form of a suspended channel with the liquid containing the samples to be analysed flowing therethrough.

Figure 2:
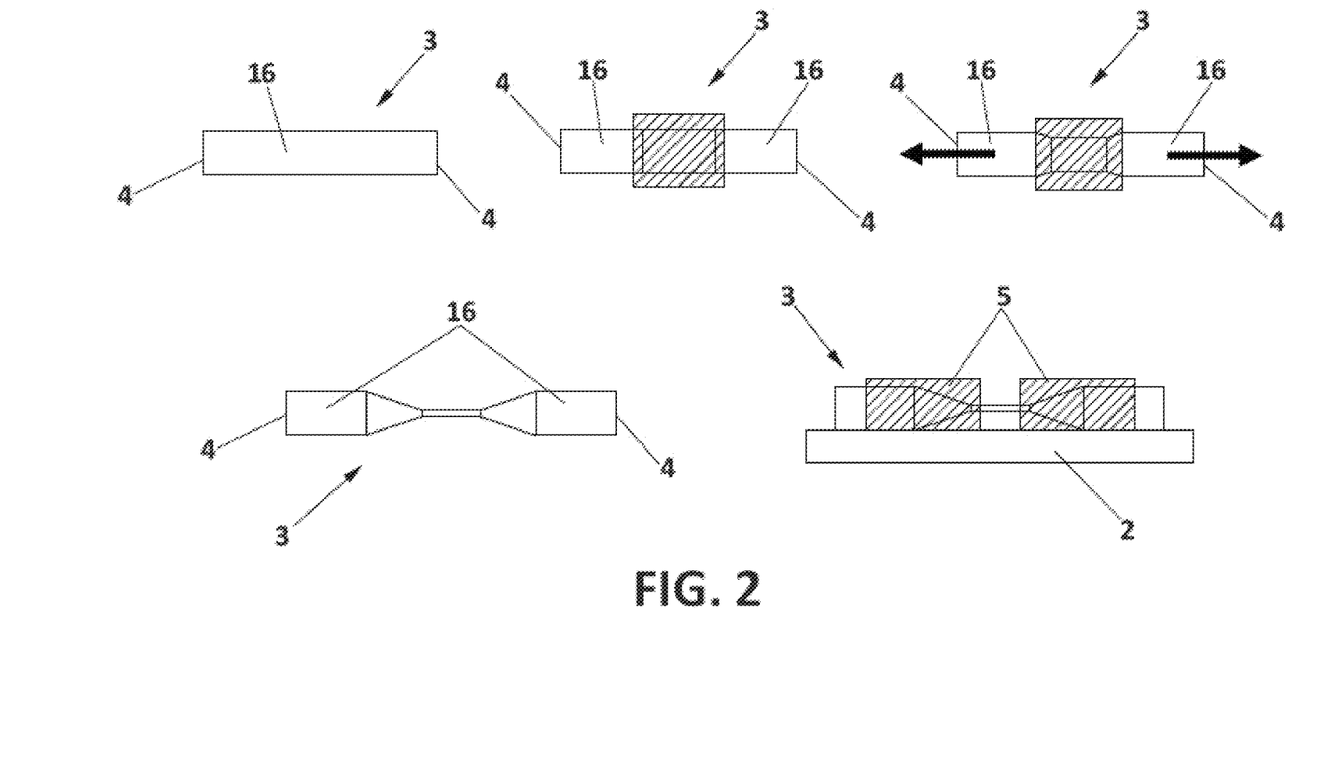
FIG. 2 shows a schematic view of the manufacturing process of the system of the invention.

FIG. 2 shows the manufacturing process of the resonating hollow elongate structure (3) made of fused silica, wherein the process comprises the following steps:

Using a capillary, that is, a hollow elongate structure (3) having a small diameter, having with two ends (4) and a protective polyimide layer (16) conferring to same flexibility and robustness. The capillary (3) is made of fused silica, as it needs to be transparent.

Removing the protective layer in the central area of the capillary (3), heating the capillary (3) by means of using a controlled flame which subjects said protective layer (16) to pyrolysis and leaves the capillary (3) exposed.

Applying axial stress to the capillary (5) while heating same, and thereby causing plastic deformation in the central area, causing the capillary (3) to be more elongate and progressively reducing the diameter of said capillary (3) until achieving a diameter of 50 µm.

Placing the capillary (3) on a reflective substrate (2), where liquid resin covering both capillary (3) and the substrate (2) is poured.

Using a mask to expose the resin on the ends (4) of the capillary (3) to ultraviolet light.

Introducing the solid assembly, that is, capillary (3) and substrate (2), in a solvent which dissolves the parts of resin exposed to ultraviolet light, there remaining two polymer supports (5) on which the capillary (3) is suspended.

Once the capillary (3) is in place, it allows the flow of the sample over a carrier liquid through the canal. The flow presents a virtually linear particle arrangement in which the particles are placed one behind the other due to the reduced diameter of the capillary (3).

The control of the flow inside the capillary (3) is performed with a pressurised nitrogen pump (12) which allows a continuous flow free of random pulses to be obtained and sets the range of pressures from 10 mbar to 7 bar, as can be seen in FIG. 1.

Since the capillary (3) is in suspension, it defines a series of characteristic mechanical modes, having specific resonance frequencies. The modes characteristic of the capillary (3) depend on, among others, the length of the suspended capillary (3), determined during the optical lithography process.

The resonance frequency of the capillary (3), however, will vary depending on the mass of the sample together with the mass of the carrier liquid.

FIG. 1 also shows a piezoelectric ceramic (6) in charge of producing vibrations in the suspended capillary (3). A piezoelectric crystal (6) is an element that is capable of converting the stresses applied into a difference in potential which generates an electrical signal and, in the same way, deforms under the application of an electric charge. This operation allows the piezoelectric ceramic (6) to exert a specific vibration on the capillary (3), controlled by the electrical signal provided to it.

The excitation signal (S2) of the piezoelectric ceramic (6) is determined by a synchronous amplifier (10) that receives the signal to be applied to the capillary (3) of a processor (11). The signal applied in this case will be a sinusoidal signal equal to the fundamental resonance frequency, the lowest one, with an amplitude of 1.5 V. Alternatively, a superior characteristic mode could be used to produce the resonance with another higher frequency.

The system (1) further comprises a second source of optical measurements shown in FIG. 1. The system (1) comprises a Helium-Neon laser (7) which emits a light beam (8), the light beam (8) passes through an optical isolator (17) which prevents a reflected beam (8) from being able to reach the laser (7) and cause a malfunction, and then passes through a neutral density filter (18) which allows the intensity of the beam (8) of the laser (7) to be regulated. The beam (8) of the laser (7) that is filtered then passes through a non-polarised beam splitter (19), which generates two beams, one of which beams (8) passes through the objective lens (20) towards the capillary (3). The light beam (8) passes through the capillary (3), is reflected on the substrate (2) and passes through the capillary (3) and the objective lens (20) again until reaching the beam splitter (19), which diverts it to a photodetector (9) which picks up the beam (8) modified due to the passage through the capillary (3) and generates a signal (S1) associated with the properties of the beam (8) that is picked up.

The photodetector (9) delivers the generated signal (S1) to the synchronous amplifier (10), which is in charge of splitting the modulated component (AC) and the unmodulated component (DC) of the signal.

The modulated component (AC) allows the spectral power density to be obtained depending on the frequency, such that it is possible to calculate the resonance frequency by means of an optical technique at each instant of time.

With this data, a measurement of the buoyant mass is taken with a closed loop configuration (PLL, phase-locked loop), in which the system is given feedback and calculates the resonance frequency, at each instant of time, adapting, within previously set margins, the frequency of the excitation signal (S2) of the piezoelectric ceramic (6), which coincides with the demodulation frequency at the resonance frequency at the previous moment, such that the phase of the signal (S1) sent by the photodetector (9) remains fixed. At each instant of time, the flow of particles inside the capillary (3) causes the resonance frequency to vary, so the resonance frequency is calculated again in a continuous manner. The PLL configuration is very useful when changes in the resonance frequency greater than 1 kHz and/or occurring at times in the order of one second are to be measured.

The processor (11) therefore receives the modulated signal (AC) in the form of an oscillation spectrum from which it is capable of determining the resonance frequency, which has changed with respect to the initial frequency due to the movement of the carrier liquid inside the capillary (3) and the flow of particles through said capillary (3). It is thereby possible to determine the resonance frequency of the capillary (3) at each instant of time.

Alternatively, the resonance frequency can be calculated with an open loop configuration, where the frequency of the signal (S2) sent to the piezoelectric ceramic (6) is set, such that the change in phase of the signal (S1) provided by the photodetector (9) between the empty capillary (3) and the capillary (3) with a particle therein is measured by means of the synchronous amplifier (10), with a sampling frequency of up to 2 kHz and a demodulation frequency equal to the resonance frequency of the capillary (3).

Taking into account that the phase response curve depending on the frequency has a linear area for frequencies similar to the resonance frequency, the measurement of the change in phase of the signal (S1) at each instant of time can be converted to a measurement of the change in frequency at each instant of time from which the resonance frequency at each instant of time can be obtained.

The open loop configuration is very useful when small changes in the resonance frequency occurring at times in the order of 100 ms are to be measured, with this configuration, in said operating range, being faster and furthermore eliminating noise problems.

Next, by means of a calibration process, a linear adjustment can be made to a curve representing the change in the resonance frequency depending on the variation in the mass of the capillary (3). The buoyant mass of the sample flowing inside the capillary (3) can thereby be calculated based on the variations in the resonance frequency, calculated by means of the closed loop configuration or preferably the open loop configuration.

Moreover, the unmodulated component of the signal supplies information, in this case about the reflectance of the sample flowing inside the capillary (3). At each instant of time, the passage of the particles of the sample modifies the intensity of the reflected beam, leaving a signal which shows the dimension and refractive index of the particles.

The system (1) thereby allows the measurement of the buoyant mass and the light scattering caused by a specific sample, such that both measurements enable the unequivocal differentiation of different particles, with different density and volume, even if they have the same buoyant mass.

The system (1) of the invention further preserves its high precision in the event of changes in the density of the carrier liquid and the refractive index thereof.

Additionally, the system (1) can be used for measuring particles in aqueous suspension, for example, for the analysis of contaminants, or cells in a physiological medium, for the diagnosis of diseases.

FIG. 1 also shows a camera (13) with an infinity objective lens which allows the changes occurring the capillary (3) to be seen in real time. The passage of particles through the channel of the capillary (3) can thereby be much more effectively controlled, and it can be ensured that the laser is well directed.

The camera (3) comprises a sensor (14) with photoelectric cells known as a charge-coupled device (CCD) and a white light source (15).

Figure 3:
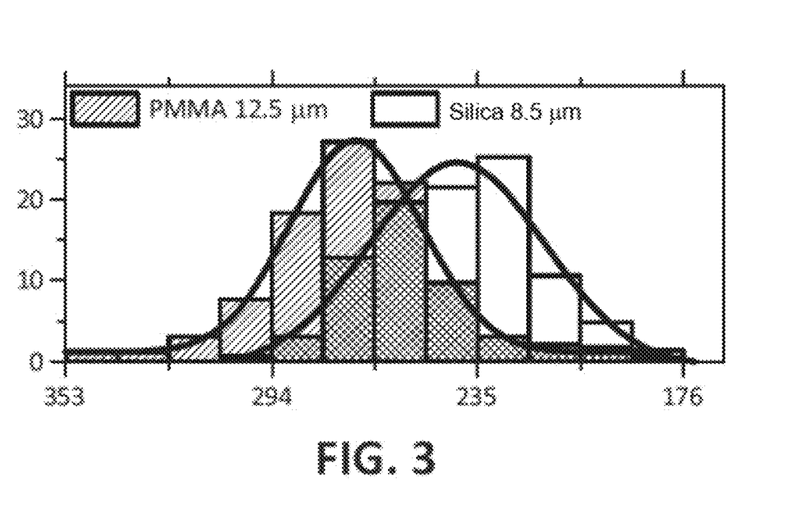
FIG. 3 shows a graph comparing the measurement of the buoyant mass obtained for two different particles by means of the system of the invention.

FIG. 3 shows an example of the buoyant mass measurements taken in of polymethyl methacrylate (PMMA) particles of 12.5 μm and silica particles of 8.5 μm. In this figure, the vertical axis represents the amount of particles of one and the same type in percentage, and the horizontal axis represents the buoyant mass. The buoyant mass of both types of particles is very similar, which makes it virtually impossible to distinguish with this measurement the presence of two different types of particles.

Figure 4:
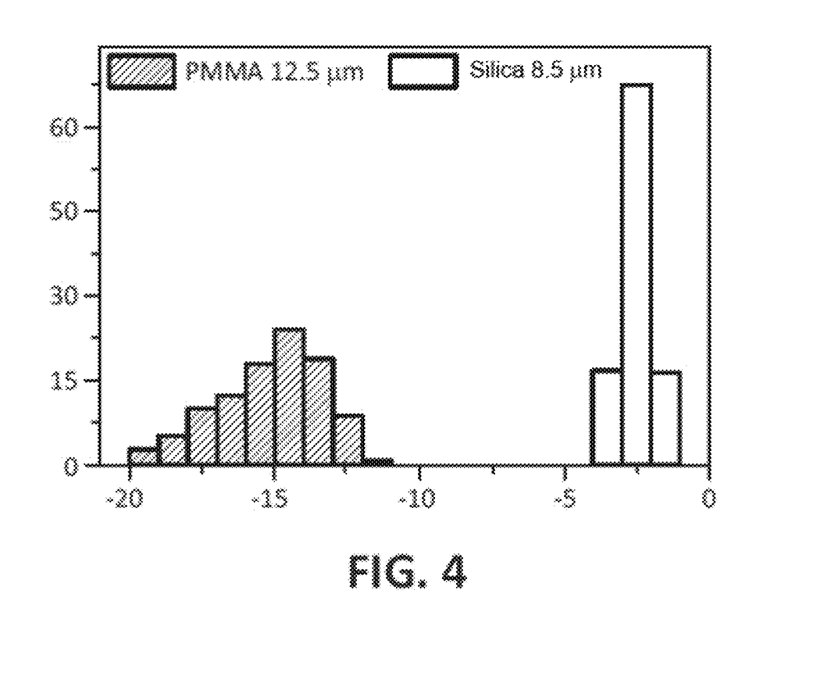
FIG. 4 shows a graph comparing the measurement of reflectance obtained for the two particles of FIG. 3 by means of the system of the invention.

FIG. 4 shows an example of the measurements taken of the reflectance of the PMMA and silica particles, analysed in FIG. 4. In this figure, the vertical axis represents the amount of particles of one and the same type in percentage, and the horizontal axis represents normalised reflectance. The reflectance of both particles is very different, allowing to clearly distinguish between both types of particles.

Figure 5:
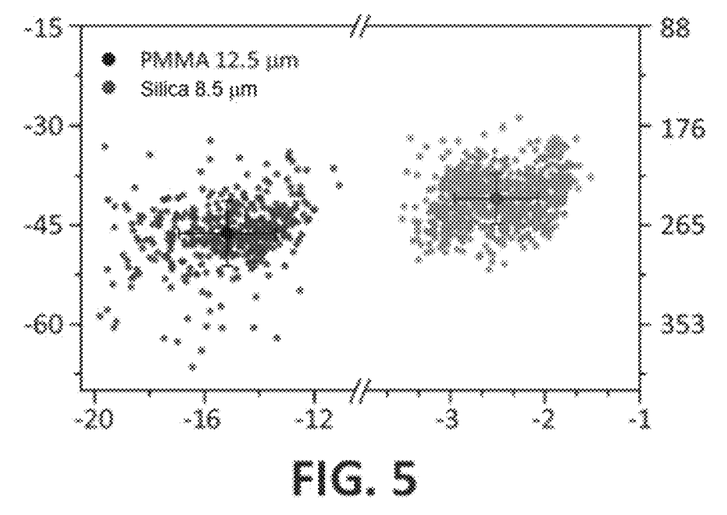
FIG. 5 shows a graph combining the measurements of buoyant mass and reflectance obtained for the two particles of FIG. 3 by means of the system of the invention.

FIG. 5 shows a map which represents the buoyant mass with respect to the normalised change in reflectance. This graph combines mechanical and optical data obtained by the system (1) of the invention. Unlike the graph in FIG. 3, which is what is typically obtained from a mechanical analysis device such as those found in the state of the art, in this new graph a clear distinction can be made between different types of particles, such as PMMA and silica particles with different sizes but which have a very similar buoyant mass that is difficult to differentiate without supplying optical measurements.

Figure 6:
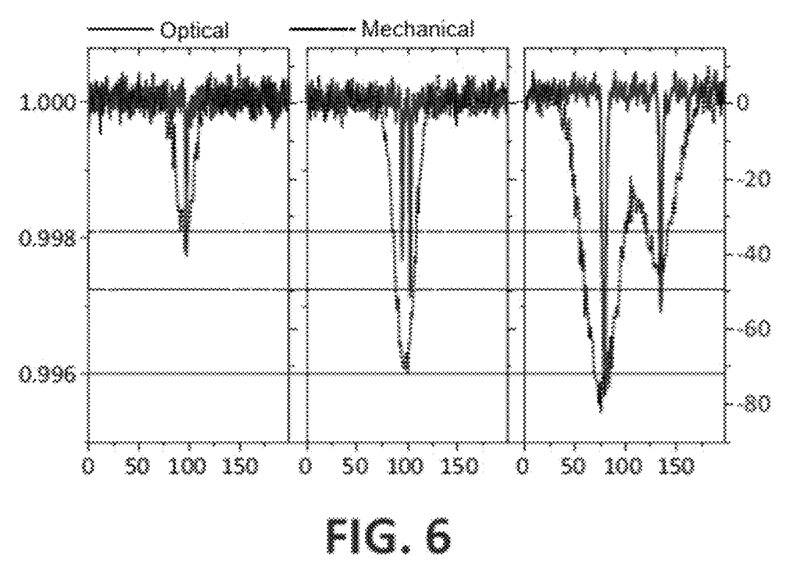
FIG. 6 shows a graph comparing the measurement of the variation in resonance frequency and reflectance obtained when one particle, two particles and one particle and one dimer, respectively, pass through the cavity by means of the system of the invention.

FIG. 6 further shows a graph which represents the capacity of the system (1) to distinguish between the measurements of one particle and several particles when they pass through the capillary at the same time. In this figure, the vertical axis represents the normalised change in reflectance in the case of the optical measurements, and the variation in resonance frequency in the case of mechanical measurements, and the horizontal axis represents time. Two particles could pass through the capillary very close to one another, such that they are both located in the suspended area at the same time. This considerably modifies the results, given that the measurement of buoyant mass is no longer of one particle, but rather of two particles. To prevent this measurement from being confused with the measurement of a single particle having a higher buoyant mass, optical measurements can be used.

Due to the fact that the measurement of optical parameters is performed only in the area impinged by the beam (8) of the laser (7), whereas the mechanical measurements are affected by particles that are located at any point of the length of the suspended capillary (3), the optical signal has a shorter time duration than the mechanical signal. This allows optical measurements to be used to determine the number of particles passing through the capillary (3) at the same time, as shown in FIG. 6.

In a particular embodiment, optical measurements are sensitive in a region coinciding with the size of the laser beam, in this case about 20 µm, whereas mechanical measurements are sensitive in a region of 500 µm. The signal of the reflectance allows to know if an event measured in the signal of the resonance frequency is due to one or several particles, and if there are several particles, it allows to separate the contribution made by each of them to the measurement of the change in resonance frequency. If two particles pass through the capillary at the same time separated a distance of less than 20 µm, they will not be distinguishable in the signal of the reflectance and, in such case, will be a dimer.

The analysis system that is shown is also capable of unambiguously classifying and differentiating cell lines. For example, in the case of healthy MCF-10A and cancerous MCF-7 cell lines, they have a very similar mean buoyant mass, namely 110 pg with a standard deviation of 40 pg and 90 pg with a standard deviation of 60 pg, respectively, such that they are indistinguishable by means of the use of only measurements derived from the resonance frequency. However, by means of the simultaneous acquisition of the buoyant mass and the reflectance of each particle measured by means of the system of the invention, the cells of both cell lines can be univocally distinguished.

The invention claimed is:

1. An analysis system for analyzing samples comprising:
   a substrate;
   a hollow elongate structure having two ends;
   two polymer supports coupled to the ends of the hollow elongate structure and joined to the substrate;
   at least one piezoelectric device coupled to the substrate and touching the hollow elongate structure, and designed to produce vibrations in said hollow elongate structure;
   at least one laser configured for emitting a laser beam,
   at least one photodetector designed to absorb the laser beam which passes through the hollow elongate structure before reaching the photodetector, and to produce an electrical signal linked to the modulation intensity and frequency of the received laser beam,
   at least one amplification module coupled connected to the piezoelectric device and to the photodetector and configured for amplifying and filtering the electrical signal provided by the photodetector, and for separating a modulated component and an unmodulated component of the signal; and
   a processor connected to the amplification module and configured for processing the amplified and filtered electrical signal and for obtaining, based on the modulated component of the signal, a measurement of the resonance frequency of the hollow elongate structure at each instant of time, which varies depending on the variation in the buoyant mass of the sample, and for obtaining, based on the unmodulated component of the signal, the reflectivity inside the hollow elongate structure at each instant of time;
   wherein the processor is further configured to provide the piezoelectric device, through the amplification module, with an excitation signal at the resonance frequency, for producing vibrations, by using said piezoelectric device, in the hollow elongate structure at the resonance frequency at each instant of time.

2. The analysis system according to claim 1, wherein the amplifier is synchronous.

3. The analysis system according to claim 1, wherein the excitation signal, which is sent to the piezoelectric device, is a sinusoidal signal at the resonance frequency.

4. The analysis system according to claim 1, wherein the piezoelectric device is made of ceramic.

5. The analysis system according to claim 1, wherein the hollow elongate structure is made of fused silica.

6. The analysis system according to claim 1, wherein the final diameter of the hollow elongate structure is about 50 µm.

7. The analysis system according to claim 1, wherein the polymer supports are made of SU8 photoresist.

8. The analysis system according to claim 1, wherein the laser used is a Helium-Neon or diode laser.

9. The analysis system according to claim 1, further comprising a pump, configured for controlling the flow inside the hollow elongate structure.

10. The analysis system according to claim 1, further comprising a camera with an infinity objective lens having a sensor with photoelectric cells, a white light source and a monitor, which allows seeing the inside of the hollow elongate structure.

11. The analysis system according to claim 1, further comprising at least one beam splitter.

12. The analysis system according to claim 1, further comprising at least one neutral density filter.

13. The analysis system according to claim 1, further comprising at least one optical isolator.

14. A manufacturing method of a hollow elongate structure, comprising the steps of:
   providing a hollow elongate structure, with two ends, having a protective layer,
   removing the protective layer in the central area of the hollow elongate structure, by heating said area,
   applying axial stress to the heated hollow elongate structure to plastically deform its central area until achieving a specific diameter,
   adhering two or more polymer supports produced on a reflective substrate at each one of the ends of the deformed hollow elongate structure, with the hollow elongate structure being suspended over the reflective substrate by means of the polymer supports.

15. The manufacturing method according to claim 14, wherein the step of adhering polymer supports at each of the ends of the cavity is performed by a centrifugal coating and using optical lithography, which applies a defined polymer pattern in the hollow elongate structure.

16. An analysis method for analyzing samples, comprising the steps of:
- providing an analysis system according to claim 1;
- actuating the laser, which emits a laser beam, impinging on the hollow elongate structure which contains the sample and is collected by the photodetector;
- generating a signal by the photodetector;
- amplifying and filtering the signal generated by the amplification module;
- splitting the signal, amplified and filtered, by the amplification module, into a modulated component and an unmodulated component;
- processing the modulated component of the signal by a processor to obtain a measurement of the resonance frequency of the hollow elongate structure at an instant of time;
- calculating, from the measured resonance frequency, a buoyant mass value at that instant of time;
- processing the unmodulated component of the signal by the processor to obtain a measurement of the reflectivity of the sample inside the hollow elongate structure at that instant of time;
- generating an excitation signal at the resonance frequency calculated by means of the processor; and
- transmitting the excitation signal generated to the piezoelectric device by the amplification module.

* * * * *

UNITED STATES PATENT AND TRADEMARK OFFICE
CERTIFICATE OF CORRECTION

PATENT NO. : 12,135,275 B2
APPLICATION NO. : 17/603161
DATED : November 5, 2024
INVENTOR(S) : Alberto Martín Pérez et al.

Page 1 of 1

It is certified that error appears in the above-identified patent and that said Letters Patent is hereby corrected as shown below:

On the Title Page

Please insert item (30) --Foreign Application Priority Data with Spanish Priority Application No. P201930327 filed 04/10/2019--.

In the Claims

Column 11, Claim 16, Line 26, after "calculated by", delete "means of".

Signed and Sealed this
Twenty-fifth Day of March, 2025

Coke Morgan Stewart
*Acting Director of the United States Patent and Trademark Office*